(12) United States Patent
Vesa

(10) Patent No.: US 7,476,815 B2
(45) Date of Patent: Jan. 13, 2009

(54) ELECTRONIC DEVICE AND GASKET FOR ELECTRONIC DEVICE FOR PROVIDING SHIELDING AGAINST ELECTROMAGNETIC INTERFERENCE

(75) Inventor: Jouko Vesa, Oulu (FI)

(73) Assignee: Nokia Corporation, Espoo (FI)

( * ) Notice: Subject to any disclaimer, the term of this patent is extended or adjusted under 35 U.S.C. 154(b) by 274 days.

(21) Appl. No.: 11/171,422

(22) Filed: Jul. 1, 2005

(65) Prior Publication Data
US 2006/0017235 A1    Jan. 26, 2006

(30) Foreign Application Priority Data
Jul. 9, 2004    (FI)    ................... 20045270

(51) Int. Cl.
H05K 9/00    (2006.01)
H01R 4/38    (2006.01)

(52) U.S. Cl. ................. 174/358; 174/370; 277/920

(58) Field of Classification Search ............... 174/358, 174/370; 361/816, 818, 800; 277/920
See application file for complete search history.

(56) References Cited

U.S. PATENT DOCUMENTS

| | | | | |
|---|---|---|---|---|
| 2,454,567 A | * | 11/1948 | Pierson, Jr. | ............... 174/351 |
| 5,524,908 A | * | 6/1996 | Reis | ............... 277/654 |
| 6,019,610 A | * | 2/2000 | Glatts, III | ............... 439/66 |
| 6,451,374 B1 | | 9/2002 | Watchko et al. | |
| 6,613,976 B1 | * | 9/2003 | Benn, Jr. | ............... 174/358 |
| 2003/0037943 A1 | * | 2/2003 | Jensen et al. | ............... 174/35 GC |

* cited by examiner

*Primary Examiner*—Hung V Ngo
(74) *Attorney, Agent, or Firm*—Squire, Sanders & Dempsey L.L.P.

(57) ABSTRACT

A gasket for an electronic device for providing shielding against electromagnetic interference. The gasket is intended to be mounted between a first structural part and a second structural part of the electronic device. The gasket comprises conductive sealant paste and a carrier structure on which the sealant paste rests. The conductive sealant paste rests on the carrier structure as sealant paste areas such that the sealant paste areas are at apertures comprised by the carrier structure that perforate the carrier structure, being supported on the carrier structure and thus generating galvanic connections through said sealant paste areas at the apertures perforating the carrier structure from a first side of the carrier structure to a second side of the carrier structure.

16 Claims, 3 Drawing Sheets

Figure 1:
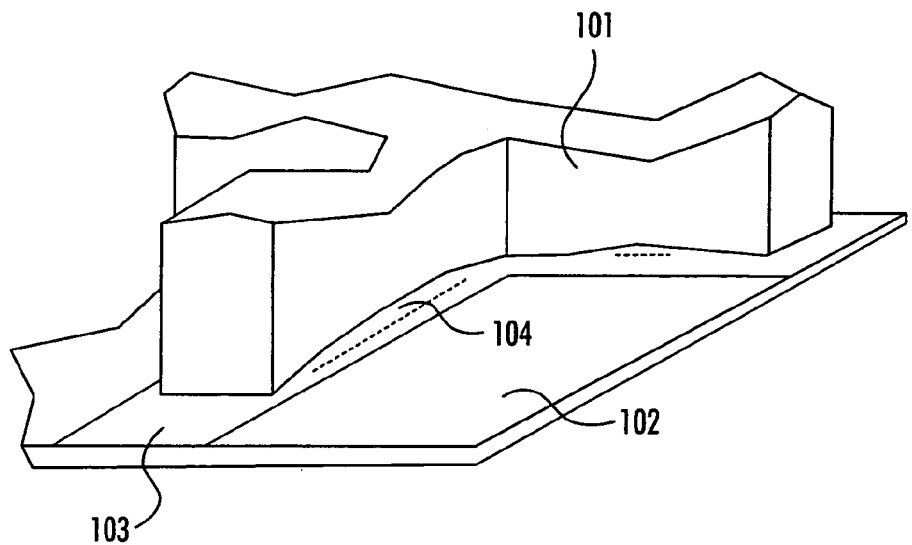


ELECTRONIC DEVICE AND GASKET FOR ELECTRONIC DEVICE FOR PROVIDING SHIELDING AGAINST ELECTROMAGNETIC INTERFERENCE

FIELD

The invention relates to a gasket for an electronic device for providing shielding against electromagnetic interference, the gasket being intended to be mounted between a first structural part and a second structural part of the electronic device, and the gasket comprising conductive sealant paste and a carrier structure on which the sealant paste rests.

The invention relates to an electronic device comprising a first structural part, a second structural part, and a gasket provided against electromagnetic interference between the first structural part and the second structural part, and the gasket comprising conductive sealant paste and a carrier structure on which the sealant paste rests.

The field of the invention is shielding of electronic devices against electromagnetic interference, i.e. EMI/EMS shielding (EMI=Electromagnetic Interference, EMC=Electromagnetic Compatibility). The term RFI (Radio Frequency Interference) is also employed. During their operation, electronic devices or parts thereof transmit electromagnetic radiation, which may interfere with another device or even another part of the same device. It is also feasible that the device is interfered with by electromagnetic radiation generated by another device. Electromagnetic radiation is particularly radio-frequency radiation within a frequency range from 10 KHz to 10 GHz.

BACKGROUND

It is previously known to strive to prevent the effect of electromagnetic interference. Shieldings are implemented by protecting the device or some parts of the device with casings or compartments or partitions of an electrically conductive material. If the casing of the device comprises a plurality of mechanically interconnected parts, these structures require an electrically conductive gasket to seal the gaps of the joining points. Such a gasket is called an EMC or EMI gasket.

The gasket does not necessarily have to constitute an integral continuous conductive circle between the electrically conductive pieces. If the gasket does not constitute an integral conductive circle, then, however, the mutual gaps of the separate conductive areas comprised by the gasket have to be dimensioned such that the gasket provides sufficiently high attenuation, i.e. isolation. One factor affecting the dimensioning is the radio frequency radiation wavelength or the wavelength half, but, in practice, however, if the radio frequency radiation wavelength is for instance some decimeters, then the gaps of the successive conductive areas of the gasket are, however, clearly shorter, i.e. 2 to 10 mm.

The gasket is particularly required because, as regards the manufacturing accuracy of the mating surfaces of the pieces to be connected, they are not necessarily as straight as would be optimal, but somewhat arched or otherwise such that galvanic insulation is not realized without a gasket.

Previously known gaskets are of the metal spring type or flexible, i.e. elastic gaskets made from an electrically conductive rubber or some other material. In a gasket having a metal spring structure, a banded thin metal ring therein comprises partly projecting claw-like spring projections cut off from said banded material, which improve the compression of the gasket between the connectable parts and thus constitute an electrically conductive connection also in places where the gap between the connectable parts could otherwise keep the connectable parts galvanically apart. Said gasket made from a metal band and provided with a claw-like projection spring can be manufactured in a plurality of ways. One way is to cut an aperture in a metal gasket band, by etching or with a tool, the aperture extending through the gasket band, followed by bending said spring-like claws to project from the basic structure of the band-like gasket. A way is also known wherein both the cutting and the bending are performed with the same tool.

Several problems are associated with prior art solutions. The gaskets are relatively expensive and laborious to manufacture, which complicates their use. Problems become emphasized in possibly even very labyrinthine gasket structures comprising a plurality of compartments or blocks. The above problems relating to the structure of the gasket and the cost of manufacture are associated with the manufacture of a conventional metal gasket, which is provided with bent, projecting claw springs cut off from a metal band. A special tool for bending is required in the manufacture of a conventional metal gasket provided with bent, projecting claw springs cut off from a metal band. Said special tool is extremely expensive, as much as 200,000 USD because of the small-sized scale of the object it is used on. If a less expensive simpler bender were used, then the achievement of the spring claws would be a work step requiring significantly much time.

Publication U.S. Pat. No. 6,451,374 discloses an implementation wherein a conductive sealant paste is sprayed directly onto the surface of either connectable piece as separate sealant paste areas, i.e. as drops, for example. However, said solution involves problems, since the structure of the sealing cannot be changed, and the sealing is in no way changeable, since no actual separate gasket component exists, only sealing material drops provided in the pieces to be connected or in one of them.

Furthermore, a solution (Laird Technologies) is known, wherein a sealing conductor pattern of a conductive material is printed directly onto the product or on top of the carrier material, but in said solution, the conductive sealant paste is on top of the sealing carrier structure, i.e. the sealing carrier structure is closed at the point whereto sealant paste has been applied. This results in the drawback that the material of the sealing carrier structure also has to be electrically conductive in order for the sealant paste to be involved in generating a conductive connection from one side of the carrier structure to the other, and thus, in practice, from a first connection piece of the electronic device to a second connection piece. Alternatively, if the carrier structure is not electrically conductive, the coating on top of the carrier material has to encircle the carrier structure on all sides, i.e. also from the sides, not only from the actual mating surfaces on the sides of the connectable structural parts in the sealing structure, since otherwise a gap of the breadth of the entire sealing structure, which would eliminate the EMC/EMI shielding, remains also between the mating surfaces of the sealing structure and, thus, also the connection parts of the electronic device. Whether an electrically conductive carrier structure or an electrically non-conductive carrier structure coated all around with an electrically conductive coating is concerned, said known sealing manner results in higher manufacturing costs and, as concerns environmental issued, poor recycling, since a carrier structure coated all around, such as a rubber carrier structure, for example, is not recyclable.

BRIEF DESCRIPTION

The object of the invention is to provide a new type of gasket and electronic device.

For achieving the above object, the invention is characterized in that the gasket is such that the conductive sealant paste rests on the carrier structure as sealant paste areas such that the sealant paste areas are at apertures comprised by the carrier structure that perforate the carrier structure, being supported on the carrier structure and thus generating galvanic connections through said sealant paste areas at the apertures perforating the carrier structure from a first side of the carrier structure to a second side of the carrier structure.

For achieving the above object, the invention is characterized in that the electronic device is such that the conductive sealant paste rests on the carrier structure as sealant paste areas such that the sealant paste areas are at apertures comprised by the carrier structure that perforate the carrier structure, being supported on the carrier structure and thus generating galvanic connections through said sealant paste areas at the apertures perforating the carrier structure from a first side of the carrier structure to a second side of the carrier structure.

Preferred embodiments of the invention are described in the dependent claims.

The invention is based on a sealant paste of a conductive material generating an electrically conductive connection through an aperture in the carrier structure between parts to be connected.

The gasket of the invention provides a plurality of advantages. The gasket of the invention is inexpensive to manufacture and easy to install. Placing sealant paste areas of a conductive material on top of a carrier structure is easier and more inexpensive for instance in respect of providing metal claws, and in addition, a better separating capacity is achieved, which means that conductive points can be placed very close to each other, since the conductive points, i.e. the conductive sealant paste areas, can be placed closer to each other than claws projecting from metal could be provided. The gasket structure of the invention allows, more easily than previously, the insulation to be provided with an adhesive surface, due to which the gasket can be fastened more easily than previously and without glue hampering the electric contact.

As compared with the known carrier structure and the structure (Laird Technologies) comprising sealant paste, the invention brings forth the advantage of not having to employ a sealing structure, which is expensive to manufacture and, as concerns environmental issues, poorly recyclable, wherein the conductive sealant paste would have to be arranged such that the carrier structure is coated all around with a conductive sealant paste. The invention provides the advantage of providing, when required, the option of employing a non-electrically conductive carrier structure without having to use an expensive manner with poor recycling properties to interconnect the sealant paste and the carrier structure. An additional advantage achieved is that, due to the apertures in the carrier structure, the compression of the sealant paste is more controllable and predictable when the connectable parts are joined together by means of the gasket. A further advantage is that the perforated carrier material, such as a netlike carrier material, for example, is inexpensive to manufacture. An example of a netlike carrier structure is a plastic net.

In the solution of the invention, when applying the conductive sealant paste onto the carrier structure, printing methods for conductor paste or solder paste or other methods of applying conductor paste or solder paste can be employed. As examples may be mentioned a so-called stencil method employing a printing mesh or a so-called dispenser method. In the stencil method, a conductive sealant paste is pressed through the printing mesh to rest on the carrier structure. In the dispenser method, the sealant paste is applied by extrusion with a dispenser to rest on the carrier structure.

LIST OF THE FIGURES

Figure 2:
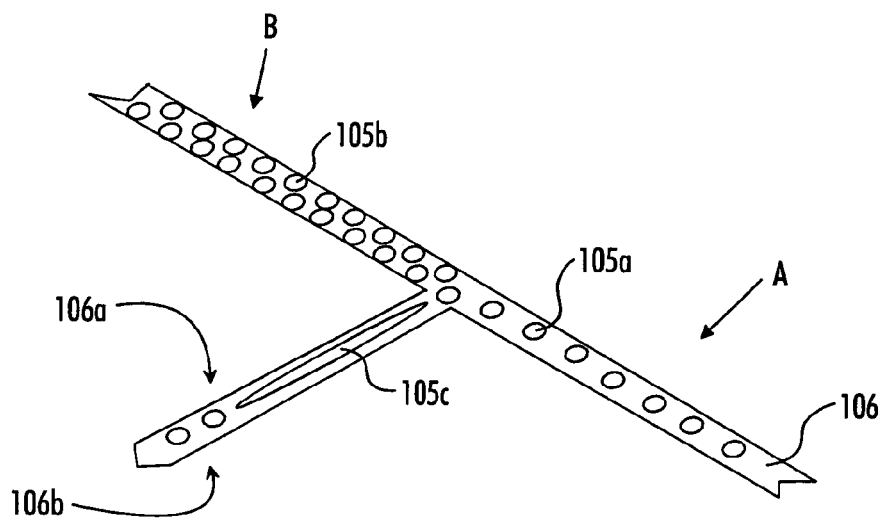
Figure 3:
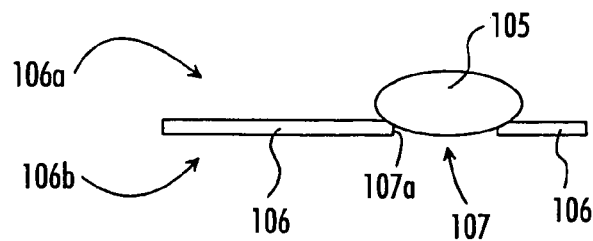
Figure 4:
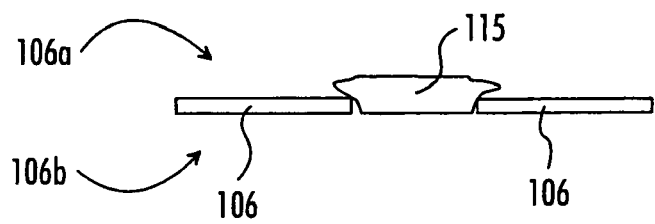
Figure 5:
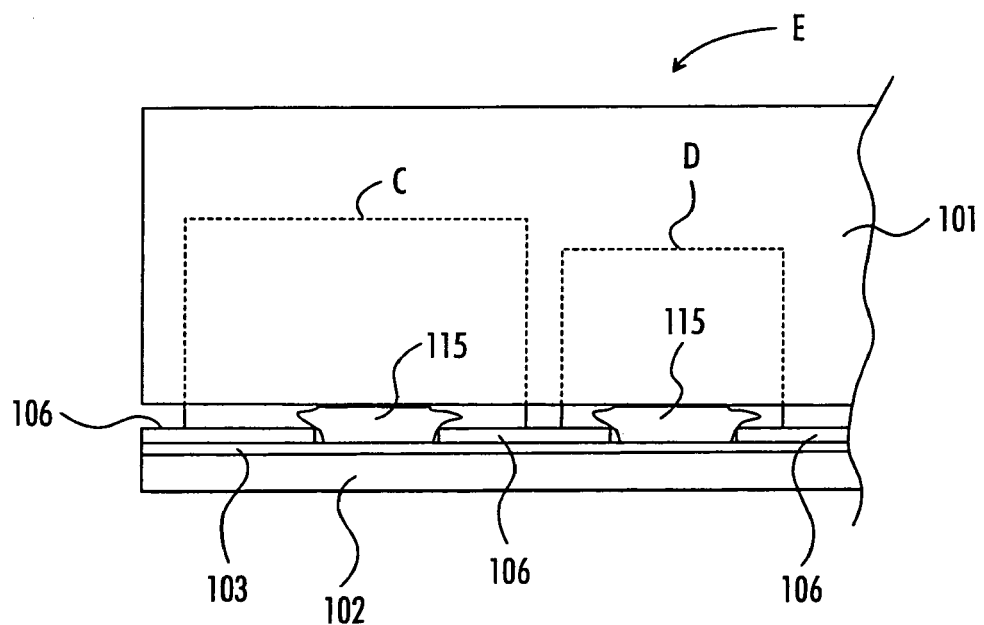
Figure 6:
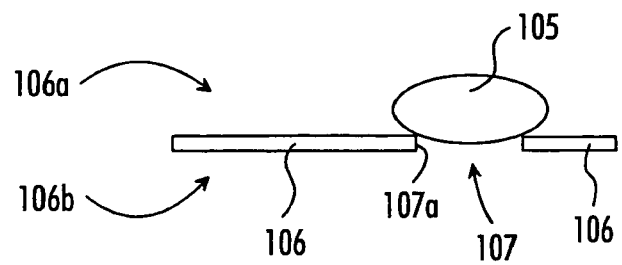

In the following, the invention will be described in more detail in connection with preferred embodiments with reference to the accompanying drawing, in which FIG. 1 shows connectable parts of an electronic device, between which is a gap to be sealed, FIG. 2 shows examples of different conductive sealant paste areas provided to rest on a carrier structure, FIG. 3 shows an uncompressed gasket at one sealant paste area, FIG. 4 shows a compressed gasket at one sealant paste area, FIG. 5 shows connected parts of an electronic device and a gasket between them, seen in a compressed state, FIG. 6 shows an uncompressed gasket at one sealant paste area of an embodiment different in respect of FIG. 3, FIGS. 7 to 9 show different embodiments of the mutual relation of a sealant paste area and an aperture in a carrier structure, seen in an uncompressed state.

DESCRIPTION OF EMBODIMENTS

With reference to FIGS. 1 to 5, there is provided an electronic device E and a gasket for the electronic device E for providing shielding against electromagnetic interference. The gasket is intended to be mounted in a first structural part 101 and a second structural part 103 of the electronic device E. The electromagnetic interference to be prevented may be generated by the electronic device itself, whereby the object is to prevent the device from interfering with other parts of the device or one or more other devices. On the other hand, the electromagnetic interference to be prevented may be interference generated by one or more other devices, whereby the object is to prevent the device to be protected from being interfered with because of interference generated by one or more other devices. The electronic device E comprises one or more components C, D, for which the shielding is implemented.

In a preferred embodiment, the electronic device E is a radio transmitter, a radio receiver or a radio transceiver. The one or more component C, D comprised by the electronic device is for instance an oscillator, a transistor, a microcircuit or a processor.

The gasket comprises conductive sealant paste and a carrier structure 106, on which the sealant paste, i.e. sealant paste areas 105, rest. FIG. 2 shows a carrier structure 106, provided with conductive sealant paste areas 105a, 105b, 105c of different shapes and different sizes, which constitutes the gasket together with said sealant paste areas 105a, 105b, 105c. Let it be mentioned that one and the same gasket does not necessarily comprise mutually different sealant paste areas, but the intention of FIG. 2 is to illustrate the different sealant paste areas that could be used in different gaskets. For the sake of clarity, in the following description, the sealant paste area is mainly designated by reference numeral 105. Let it be mentioned that in FIGS. 4 to 5, the sealing areas are in a compressed form and they are designated with a different reference numeral, i.e. reference numeral 115.

The conductive sealant paste rests on the carrier structure as sealant paste areas 105 such that the sealant paste areas 105 are at apertures 107 comprised by the carrier structure 106 that perforate the carrier structure and rest on the carrier structure. Accordingly galvanic connections are created through the sealant paste areas 105 at the apertures 107 perforating the carrier structure 106 from a first side 106a of the carrier structure 106 to a second side 106b of the carrier structure, and, thus, in practice, from a first connection piece 101 to a second connection piece 103 of the electronic device.

The gasket 105, 106 is part of a connection arrangement. With special reference to FIG. 5 and partly also to FIG. 1, a connection arrangement is concerned wherein a first structural part 101, such as a frame 101, of for instance a base station in a mobile telephone network, is placed against a second structural part 103 of the electronic device. Said second structural part may be a conductive plane 103 comprised by a circuit board 102 comprising electronic components. The conductive plane 103 may be the ground potential plane of the circuit board. FIG. 1 shows a gap 104 that is to be sealed by means of the conductive gasket shown in FIG. 5, in order to achieve shielding for preventing the effect of electromagnetic interference. Accordingly, FIG. 1 shows no gasket, but FIG. 5 shows a gasket, i.e. FIG. 5 shows an actual connection arrangement, since it shows a gasket between the structural parts 101 and 103 to be interconnected.

As regards the achievement of electromagnetic shielding, the most essential structure of the gasket is the conductive sealant paste 105.

FIG. 3 shows the relation between a conductive sealant paste area 105, and a carrier structure 106, and an aperture 107 therein in the direction of the plane of a carrier structure 106 transverse to the gasket and before compression. FIG. 4, in turn, shows corresponding structures after the gasket is compressed between the parts 101 and 103 to be interconnected in the manner shown in FIG. 5. Let it be pointed out that reference numeral 115 is thus used to designate the compressed sealant paste area.

In a preferred embodiment of the invention, the implementation is such that the sealant paste constituting the sealant paste areas 105 resting on the carrier structure 106, at least before the gasket is subjected to compression between the structural parts of the electronic device, is arranged as separate sealant paste areas 105. This results in there being no sealant paste between the sealant pastes areas 105, i.e. in savings in sealant paste and thus, in savings in costs. Another advantage is that because of the separate sealant paste areas, dot-like, i.e. locally more effective connections are achieved between the parts 101, 103 to be connected as compared with a situation wherein the entire sealant paste would be one continuous circle or a circle constituted by a few longer partial areas. A still more significant additional advantage in respect of the above described is that the necessary compression force for connecting the parts to be connected on the different sides of the gasket can then be lower, due to which the structures can be lighter, and fewer screws and the like fastening means are required.

In a preferred embodiment of the invention, with reference to FIGS. 3 and 6 to 8, the embodiment is such that the diameter of the sealant paste area 105 at the aperture 107 comprised by the carrier structure 106, when studied before the gasket is subjected to compression between the structural parts 101, 103 of the electronic device, is larger than the diameter of the aperture 107 comprised by the carrier structure 106. In FIGS. 3 and 6 to 8, the area covered by the sealant paste area 105 is at least as large as or larger than the area of the aperture 107 in the carrier structure 106.

Figure 9:
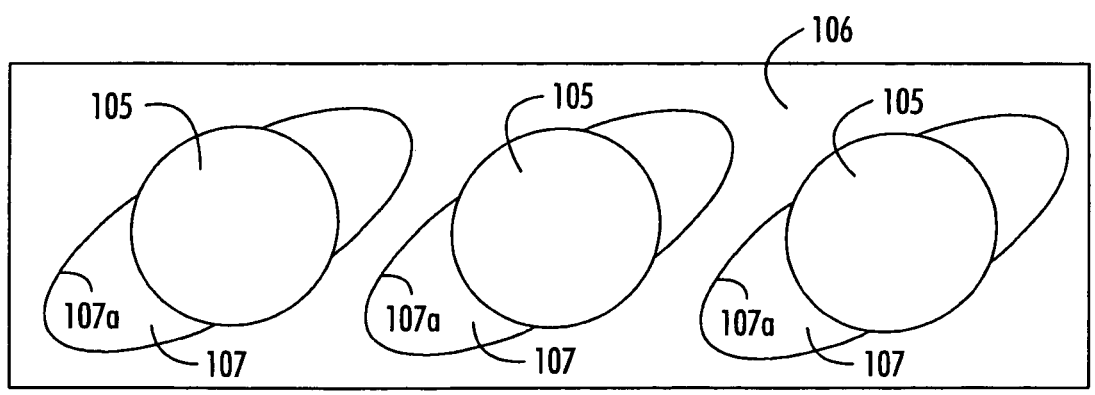

In FIG. 9, the area covered by the sealant paste area 105 is smaller than the area of the aperture 107 in the carrier structure 106.

Figure 7:
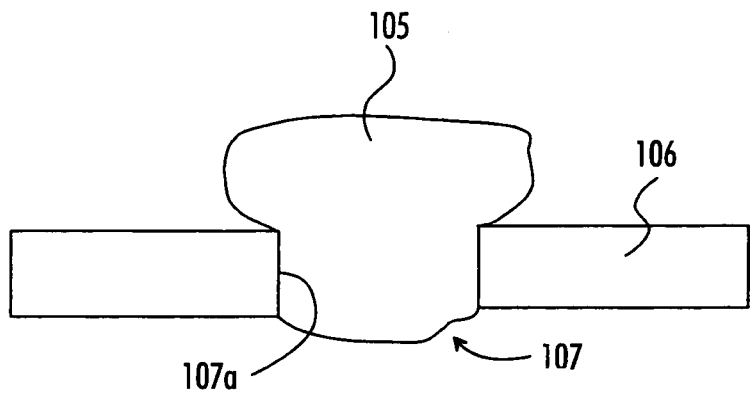
Figure 8:
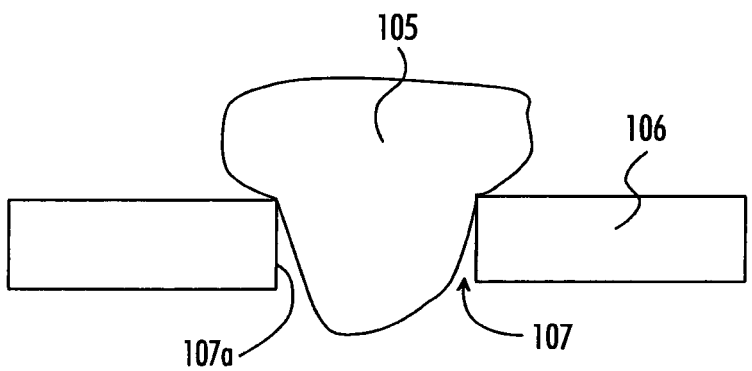

In a preferred embodiment, with reference for instance to FIG. 3 and FIGS. 7 to 8, the sealant paste area 105 extends inside the aperture 107 comprised by the carrier structure to an area defined by an aperture wall 107a comprised by the carrier structure 106 throughout the entire distance that the aperture 107 extends in the permeation direction of the aperture, since in this case the galvanic connection is obtained through the sealant paste areas 105 to the carrier structure 106 from the first side 106a to the second side 106b without the parts 101, 103 to be connected being strongly compressed against each other, since the sealant paste area 105 of the length of the reach of the aperture establishes the connection even without compression. This being so, the advantage is that the compression between the parts 101, 103 to be connected does not necessarily play such a critical role, although a larger force is required than in applying for instance a sealant paste area comprising rubber as the basic material laterally outside the aperture 107. In the embodiment shown in FIG. 7, the sealant paste area 105 extends through the aperture 107 of the carrier structure 106 within the entire area of the aperture when studied transversely to the aperture, but in the embodiment shown in FIG. 8, the sealant paste area 105 extends through the aperture 107 of the carrier structure 106 within a smaller area than in the entire area of the aperture.

With reference to FIG. 6, an alternative to the embodiments of FIGS. 3 and 7 to 8 is, in accordance with FIG. 6, such an embodiment wherein the sealant paste area does not extend through the aperture 107 until after the compression. In this embodiment, the compression plays a more critical role in order for the sealant paste area to be able to galvanically connect the parts 101, 103 to be connected, albeit the required force does not have to be so high, since a sealant paste area containing for instance rubber as the basic material is characterized by shape elasticity, which contributes to the extension of the sealant paste area to connect the parts 101 and 103. In the embodiment of FIG. 6, in contrast to FIGS. 3 and 7 to 8, still studied prior to the gasket being subjected to compression between the structural parts of the electronic device, the embodiment is such that the sealant paste area 105 extends inside the aperture 107 comprised by the carrier structure 106 within the area defined by the aperture wall 107a comprised by the carrier structure 106 only part of the distance that the aperture 107 extends in the permeation direction of the aperture.

As regards FIG. 2, it is noted that in the area indicated by arrow B, the sealant paste areas 105b are at shorter distances than in the area indicated by arrow A comprising the sealant paste areas 105a, and thus the set composed by the conductive sealant paste areas 105b in the area indicated by arrow B is capable of preventing electromagnetic radiation having a higher frequency, i.e. a shorter wavelength, than the sealant paste areas 105a within the area indicated by arrow A. The use of several separate sealant paste areas enables the generation of an isolation of the desired magnitude at the desired places.

With reference to FIG. 2, it is noted that the sealant paste areas 105b in the area illustrated by arrow B are slightly overlapping, i.e. alternately on different sides in respect of the midline of the set composed by the successive sealant paste areas 105b. This solution provides better isolation and, due to the overlap, a narrower structure. FIG. 2 also shows that the shape of a sealant paste area, such as 105c, can also be other than dot-like, i.e. for instance long in respect of the width. A continuous sealant paste area that is long in respect of its width provides good local isolation at critical points.

In a preferred embodiment of the invention, the gasket is such that the height of the conductive sealant paste area 105 is for instance 0.5 to 1 mm and the diameter 1 to 2 mm, and the distance between the sealant paste areas is 2 to 10 mm.

The sealant paste material and the compressive force between the structural parts 101 and 103 to be interconnected are selected such that the compression illustrated in FIG. 4, i.e. the lowering of the sealant paste area is sufficient. For some sealant pastes, the compression is at least 5 to 10% and at most 30 to 50%.

According to the Applicant's observations, a suitable mutual distance for said conductive sealant paste areas 105 is 2 to 10 mm when the intention is to provide for radiation having a wavelength of decimeters. A suitable dimensioning is found out by means of calculation formulas, simulation and tests.

A suitable material for a conductive sealant paste is an elastomer. The sealant paste comprises basic material, which is for instance silicone, fluorosilicone or rubber, such as EPDM rubber. Conductive filler is mixed into the basic material. The conductive filler may be for instance silver-coated copper, silver-coated aluminum, silver-coated nickel or silver-coated glass.

In a preferred embodiment of the invention, the invention is such that a mat having holes and made from a rubber material is employed as the carrier structure, i.e. basic material, of the conductive sealant paste 105, into which holes conductive sealant paste such as elastomer, for example, is thus sprayed. This provides an EMI/EMC gasket that also acts as a so-called IP (IP=ingress shielding) gasket. An IP gasket means that it prevents the entry of humidity and impurities, such as dust, into the object to be protected. Thus, an IP gasket is a gasket preventing environmental effects.

In a preferred embodiment of the invention, the invention is such that the carrier material is of an electrically non-conductive suitable material, avoiding the use of an expensive material. The material of the carrier material can be for instance a plastic film or strong paper.

Although the invention is described above with reference to the example in accordance with the accompanying drawings, it will be appreciated that the invention is not to be so limited, but it may be modified in a variety of ways within the scope of the appended claims.

The invention claimed is:

1. An apparatus comprising:
   conductive sealant paste; and
   a carrier structure on which the sealant paste rests,
   wherein the apparatus is mounted between a first structural part and a second structural part of an electronic device,
   wherein the conductive sealant paste is configured to rest on the carrier structure as sealant paste areas such that the sealant paste areas are at apertures comprised by the carrier structure that perforate the carrier structure, being supported on the carrier structure and thus configured to generate galvanic connections through said sealant paste areas at the apertures perforating the carrier structure from a first side of the carrier structure to a second side of the carrier structure, and
   wherein, prior to the apparatus being subjected to compression between the structural parts of the electronic device, the sealant paste area is configured to extend inside an aperture comprised by the carrier structure within an area defined by an aperture wall comprised by the carrier structure throughout an entire distance that the aperture extends in a permeation direction of the aperture.

2. The apparatus as claimed in claim 1, wherein, prior to the apparatus being subjected to compression between the structural parts of the electronic device, the sealant paste area is configured to extend inside an aperture comprised by the carrier structure within an area defined by an aperture wall comprised by the carrier structure only part of a distance that the aperture extends in a permeation direction of the aperture.

3. The apparatus as claimed in claim 1, wherein a diameter of the sealant paste area at an aperture comprised by the carrier structure, prior to the apparatus being subjected to compression between the structural parts of the electronic device, is larger than a diameter of the aperture comprised by the carrier structure.

4. The apparatus as claimed in claim 1, wherein the sealant paste constituting the sealant paste areas resting on the carrier structure is configured as separate sealant paste areas at least before the apparatus is subjected to compression between the structural parts of the electronic device.

5. The apparatus as claimed in claim 1, wherein the carrier structure comprises an electrically non-conductive material.

6. The apparatus as claimed in claim 5, wherein the carrier structure comprises one of paper and another fibrous material.

7. The apparatus as claimed in claim 1, wherein the carrier structure comprises one of rubber and plastic.

8. The apparatus as claimed in claim 1, wherein a material of the carrier structure comprises one of rubber and another corresponding material, making the apparatus a composite seal for preventing both harmful effects of electromagnetic radiation and harmful effects of environmental conditions.

9. An apparatus comprising:
   a first structural part;
   a second structural part; and
   a gasket provided against electromagnetic interference between the first structural part and the second structural part, the gasket comprising conductive sealant paste and a carrier structure on which the conductive sealant paste rests,
   wherein the conductive sealant paste is configured to rest on the carrier structure as sealant paste areas such that the sealant paste areas are at apertures comprised by the carrier structure that perforate the carrier structure, being supported on the carrier structure and thus configured to generate galvanic connections through said sealant paste areas at the apertures perforating the carrier structure from a first side of the carrier structure to a second side of the carrier structure, and
   wherein, prior to the gasket being subjected to compression between the structural parts of the apparatus, the sealant paste area is configured to extend inside an aperture comprised by the carrier structure within an area defined by an aperture wall comprised by the carrier structure throughout an entire distance that the aperture extends in a permeation direction of the aperture.

10. The apparatus as claimed in claim 9, wherein a diameter of the sealant paste area at an aperture comprised by the carrier structure, prior to the gasket being subjected to compression between the structural parts of the apparatus electronic device, is larger than a diameter of the aperture comprised by the carrier structure.

11. The apparatus as claimed in claim 9, wherein the conductive sealant paste constituting the sealant paste areas resting on the carrier structure is configured as separate sealant paste areas at least before the gasket is subjected to compression between the structural parts of the apparatus.

12. The apparatus as claimed in claim 9, wherein the carrier structure comprises an electrically non-conductive material.

13. The apparatus as claimed in claim 12, wherein the carrier structure comprises one of paper and another fibrous material.

14. The apparatus as claimed in claim 9, wherein the carrier structure comprises one of rubber and plastic.

15. The apparatus as claimed in claim 9, wherein a material of the carrier structure comprises one of rubber and another corresponding material making the gasket a composite seal for preventing both harmful effects of electromagnetic radiation and harmful effects of environmental conditions.

16. The apparatus as claimed in claim 9, wherein, prior to the gasket being subjected to compression between the structural parts of the apparatus, the sealant paste area is configured to extend inside an aperture comprised by the carrier structure within an area defined by an aperture wall comprised by the carrier structure only part of a distance that the aperture extends in a permeation direction of the aperture.

\* \* \* \* \*